(12) United States Patent
Tasaki et al.

(10) Patent No.: US 8,224,605 B2
(45) Date of Patent: Jul. 17, 2012

(54) INSPECTION STANDARD SETTING DEVICE, INSPECTION STANDARD SETTING METHOD AND PROCESS INSPECTION DEVICE

(75) Inventors: Hiroshi Tasaki, Nara (JP); Kazuto Kojitani, Osaka (JP)

(73) Assignee: OMRON Corporation, Kyoto (JP)

( * ) Notice: Subject to any disclaimer, the term of this patent is extended or adjusted under 35 U.S.C. 154(b) by 1399 days.

(21) Appl. No.: 11/433,702

(22) Filed: May 12, 2006

(65) Prior Publication Data

US 2006/0271226 A1 Nov. 30, 2006

(30) Foreign Application Priority Data

May 12, 2005 (JP) ................. 2005-139903

(51) Int. Cl.
*G01N 37/00* (2006.01)
*G06F 19/00* (2011.01)
(52) U.S. Cl. .............. 702/83; 702/81; 702/82; 700/109; 382/145; 382/149
(58) Field of Classification Search .............. 702/81–83
See application file for complete search history.

(56) References Cited

U.S. PATENT DOCUMENTS

| | | | |
|---|---|---|---|
| 2002/0009220 A1* | 1/2002 | Tanaka | 382/145 |
| 2002/0195574 A1* | 12/2002 | Tanaka et al. | 250/492.3 |
| 2005/0159973 A1* | 7/2005 | Krause et al. | 705/1 |
| 2005/0246045 A1* | 11/2005 | Sugihara et al. | 700/109 |
| 2006/0115143 A1* | 6/2006 | Auerbach | 382/149 |

FOREIGN PATENT DOCUMENTS

JP 2004-214394 7/2004

OTHER PUBLICATIONS

Patent Abstracts of Japan; Publication No. 2004-214394; date of publication: Jul. 29, 2004 (13 pages).

* cited by examiner

*Primary Examiner* — Jonathan C Teixeira Moffat
(74) *Attorney, Agent, or Firm* — Osha • Liang LLP

(57) ABSTRACT

An information processing device stores an extracted feature of each inspection item of the process inspection, and a determination result of a final inspection in a memory device, calculates a separation degree between a distribution of features of products which were determined as good products at the final inspection and a distribution of features of products which were determined as defective products at the final inspection for every inspection item or every combination of inspection items based on data of the products stored in the memory device, selects an inspection item whose inspection standard is to be reset from the inspection items or the combinations of the inspection items based on a value of the separation degree. Thus providing a method of appropriately setting an inspection standard for detecting a defect sign during process inspection. Further a process inspection device and inspection standard setting device which implements the same.

13 Claims, 11 Drawing Sheets

Fig. 2

| Inspection item | Feature 1 | Unit 1 | Feature 2 | Unit 2 | Inspection standard |
|---|---|---|---|---|---|
| Insufficient solder inspection | Solder area | % | | | aaa |
| Excessive solder inspection | Solder area | % | | | bbb |
| Relative X-displacement inspection between solder and land | Gravity center X-displacement | 0.01 mm | | | ccc |
| Relative Y-displacement inspection between solder and land | Gravity center Y-displacement | 0.01 mm | | | ddd |
| Sag/blur inspection (vertical direction) | Blur width in vertical direction | % | Blur length in vertical direction | Pixel | eee |
| Sag/blur inspection (horizontal direction) | Blur width horizontal direction | % | Blur length in horizontal direction | Pixel | fff |
| .. | .. | | .. | .. | .. |

Fig. 3

| Inspection item | Feature 1 | Unit 1 | Feature 2 | Unit 2 | Inspection standard |
|---|---|---|---|---|---|
| Angle inspection | Component angle | Degree | | | aaa |
| Lateral displacement inspection | Lateral displacement | 0.01mm | | | bbb |
| Vertical displacement inspection | Vertical displacement | 0.01mm | | | ccc |
| Component kind inspection | Degree of coincidence | % | | | ddd |
| IC lead lateral displacement inspection | Lateral displacement | 0.01mm | | | eee |
| IC lead vertical displacement inspection | Vertical displacement | 0.01mm | | | fff |
| .. | .. | .. | .. | .. | .. |

Fig. 5

| Board number | Component number | Print inspection (process inspection 1) | | | Mount inspection (process inspection 2) | | | Board inspection (final inspection) |
|---|---|---|---|---|---|---|---|---|
| | | Insufficient solder inspection | Excessive solder inspection | ... | Angle inspection | Lateral displacement inspection | ... | |
| 0001 | 001 | 62% | 62% | ... | -1 degree | 0.32mm | ... | OK |
| 0001 | 002 | 60% | 60% | ... | 0 degree | 0.57mm | ... | OK |
| 0001 | 003 | 65% | 65% | ... | -3 degree | 0.39mm | ... | NG (fillet defect) |
| 0001 | 004 | 69% | 69% | ... | 2 degree | 0.70mm | ... | NG (wet defect) |
| 0002 | 001 | 59% | 59% | ... | 4 degree | 0.44mm | ... | OK |
| 0002 | 002 | 64% | 64% | ... | 1 degree | 0.21mm | ... | OK |

Fig. 11

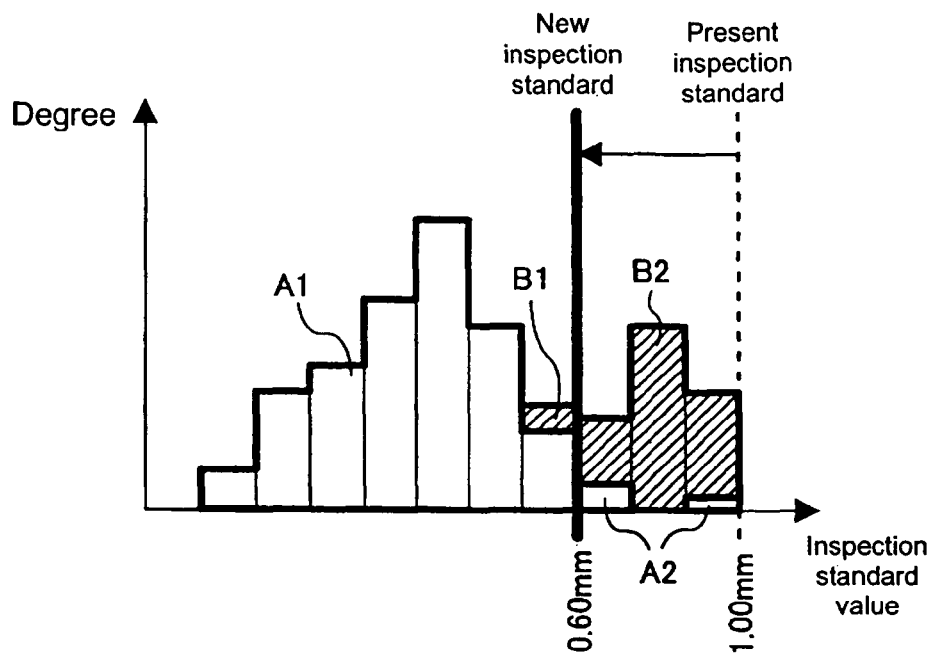

<Process inspection>
 Yield rate = (A1+B1)/(A1+A2+B1+B2)
 Over detection rate=A2/(A1+A2+B1+B2)

<Final inspection>
 Yield rate=A1/(A1+B1)
 Defect rate=B1/(A1+B1)

A1 : Degree of good product satisfying new inspection standard
A2 : Degree of good product not satisfying new inspection standard
B1 : Degree of defective product satisfying new inspection standard
B2 : Degree of defective product not satisfying new inspection standard

INSPECTION STANDARD SETTING DEVICE, INSPECTION STANDARD SETTING METHOD AND PROCESS INSPECTION DEVICE

BACKGROUND OF THE INVENTION

1. Field of the Invention

The present invention relates to a technique for setting an inspection standard to be used in process inspection in an intermediate process on a production line.

2. Description of the Related Art

On a production line comprising a plurality of processes, process inspection for determining pass or fail of an intermediate product is performed at each intermediate process as well as a final inspection for determining overall pass of fail of a product.

The goal of the process inspection is to find an intermediate product that does not satisfy a quality level determined during the process and to prevent the defective product from entering the next process. In order to do this, an inspection standard (for example a threshold value for determining pass or fail of the intermediate product) is set according to a quality level (tolerance, etc.) that is determined in each process.

However, an intermediate product which satisfies a certain quality level does not always become a good product at the last stage. Even when the intermediate product satisfies the quality level, it could contain a potential defect factor which induces a defect in the following process. Such a potential defect factor is referred to as a "defect sign" hereinafter. Thus it is desirable to reject not only the intermediate product that does not satisfy the quality leave, but also an intermediate product that has a defect sign, preventing the defect from being generated in the following processes.

Nonetheless, it is very difficult to appropriately set an inspection standard to detect the defect sign because it is difficult to clarify and quantify a causal correlation between the degree of the defect sign and probability of defect generation in the following process. Furthermore, when there are several inspection items in the process inspection, it is difficult to specify which inspection standard of the inspection items was effectively adjusted. If the inspection standard is too strict because of a high priority on finding a defect sign, the yield rate (the rate of the number of the accepted products to the total number in the inspection) is lowered, causing the yield to deteriorate or reinspection costs to increase.

A technique to support inspection standard setting is disclosed in Japanese Unexamined Patent Publication No. 2004-214394 and is well known. However, according to this method, although an over detection rate of the inspection result is calculated and displayed for a user to confirm whether or not the over detection rate satisfies a predetermined management standard, it only urges the user to determine whether it is necessary to adjust an inspection standard. That is, this method is cannot be used for determining how the inspection standard of an inspection item of a certain process is adjusted.

SUMMARY OF THE INVENTION

In view of the above circumstances herein is provided a technique for appropriately setting an inspection standard to detect a defect sign in a process inspection.

The present invention provides a technique to set inspection standards (or support to set the inspection standard) for a plurality of inspection items on a production line which executes a process inspection determining pass or fail of an intermediate product by comparing a feature extracted from the intermediate product with a predetermined inspection standard, and a final inspection determining pass or fail of a completed product at a final process.

The process inspection is performed by a process inspection device. The process inspection device extracts a feature from the intermediate product according to the inspection item using a well-known sensing technique. For example, an image of the intermediate product is taken by an imaging sensor and the various kinds of features (position, size, configuration, color, contrast, frequency spectrum, texture and the like) are extracted from the image by an image processing or an image recognition, a temperature of the intermediate product is measured by a heat sensor, or a stress or a torque applied onto the intermediate product is measured by a pressure sensor. Thus, the process inspection device determines whether the intermediate product satisfies the inspection standard or not by comparing the extracted feature with a predetermined inspection standard. The kind of the feature to be extracted and the value of the inspection standard to be compared are previously determined inspection item. A plurality of inspection items may be inspected by one process inspection device or one or more inspection items may be inspected by each of the plurality of process inspection devices.

In one embodiment, an inspection standard setting device comprises an information processing device including at least a memory device and a display. In addition, the process inspection device may also include an inspection standard setting device as one unit.

The inspection standard setting device stores a (value of) extracted feature of each inspection item at the process inspection and a determination result at the final inspection in the memory device. When the final inspection is automatically performed by the final inspection device, the determination result may be automatically recorded in the memory device of the inspection standard setting device. Alternatively, when the final inspection is manually performed, the determination result may be inputted to the inspection standard setting device by an operator.

The inspection standard setting device further comprises a separation degree calculation unit that calculates the degree of separation between a product determined to be good and a product determined to be defective at final inspection from a distribution of extracted features of inspection items or combinations of inspection items as well as data of a plurality of products stored in memory.

It can be said that the separation degree is a quantified strength of the causal correlation between the inspection item to be inspected at the process inspection and the defective product inspected at the final inspection. That is, when the causal correlation between the inspection item and the defective product is small, a value of the feature of that inspection item is varied regardless of whether the product is good or defective and the separation degree is decreased, meanwhile when the causal correlation between them is great, there is a big difference between the value of the feature of the good product and the value of the feature of the defective product and the separation degree is increased.

Thus it is possible for the inspection standard setting device can select the inspection item whose inspection standard is to be reset based on the value of the separation degree.

In other words, the inspection item having a strong causal correlation with the defect generation, that is, the inspection item which can correctly detect the defect sign can be easily specified.

As such the inspection standard setting device also comprises a target item selection unit which selects the inspection item or the combination of the inspection items having the highest separation degree as the inspection item whose inspection standard is to be reset. Therefore inspection item whose inspection standard is to be reset can be automatically determined.

The inspection standard setting device sets a new inspection standard for the selected inspection item by the inspection standard setting unit. Accordingly the new inspection standard can be appropriately set to detect the defect sign at the process inspection.

In a particular embodiment the inspection standard setting unit calculates variations of the determination results at the process inspection and the final inspection in a case where the new inspection standard is used, calculates cost effects provided by the variations of the determination results using a predetermined cost function, and determines the new inspection standard so that the calculated cost effect may become a maximum value. Thus, the new inspection standard can be automatically determined.

In yet another embodiment, when a user inputs the new inspection standard, the inspection standard setting unit may calculate and present variations of the determination results at the process inspection and the final inspection in the case where the new inspection standard is used. Thus, by such interface, the user can simulate variations in determination results when the inspection standard is changed and find an optimal value of the inspection standard.

This technique can be applied to the inspection standard setting device or the process inspection device having at least one of the above units. Or this technique can be applied to an inspection standard setting method comprising at least one of the above processes, or an inspection standard setting program for implementing the methodCombination of units and/or processes outlined in the above embodiments remain within the spirit and scope of the invention.

By using the above techniques, the inspection standard can be appropriately set to detect the defect sign in the process inspection.

BRIEF DESCRIPTION OF THE DRAWINGS

FIG. 2 shows an example of a list of inspection items at a solder print process;

FIG. 3 shows an example of a list of inspection items at a component mount process;

FIG. 5 shows an example of a data structure of an inspection result DB;

FIG. 11 shows a calculation method of a variation of a determination result.

DETAILED DESCRIPTION OF THE PREFERRED EMBODIMENTS

Preferred embodiments of the present invention will be described in detail with reference to the drawings. Here, a description will be made of a case where this embodiment is applied to a production line in which an electronic component is mounted on a surface of a board. However, this and other embodiments may be applied not only to the surface mount line but also to various kinds of production lines in which a process inspection and a final inspection are performed.

(Surface Mount Line)

Figure 1:
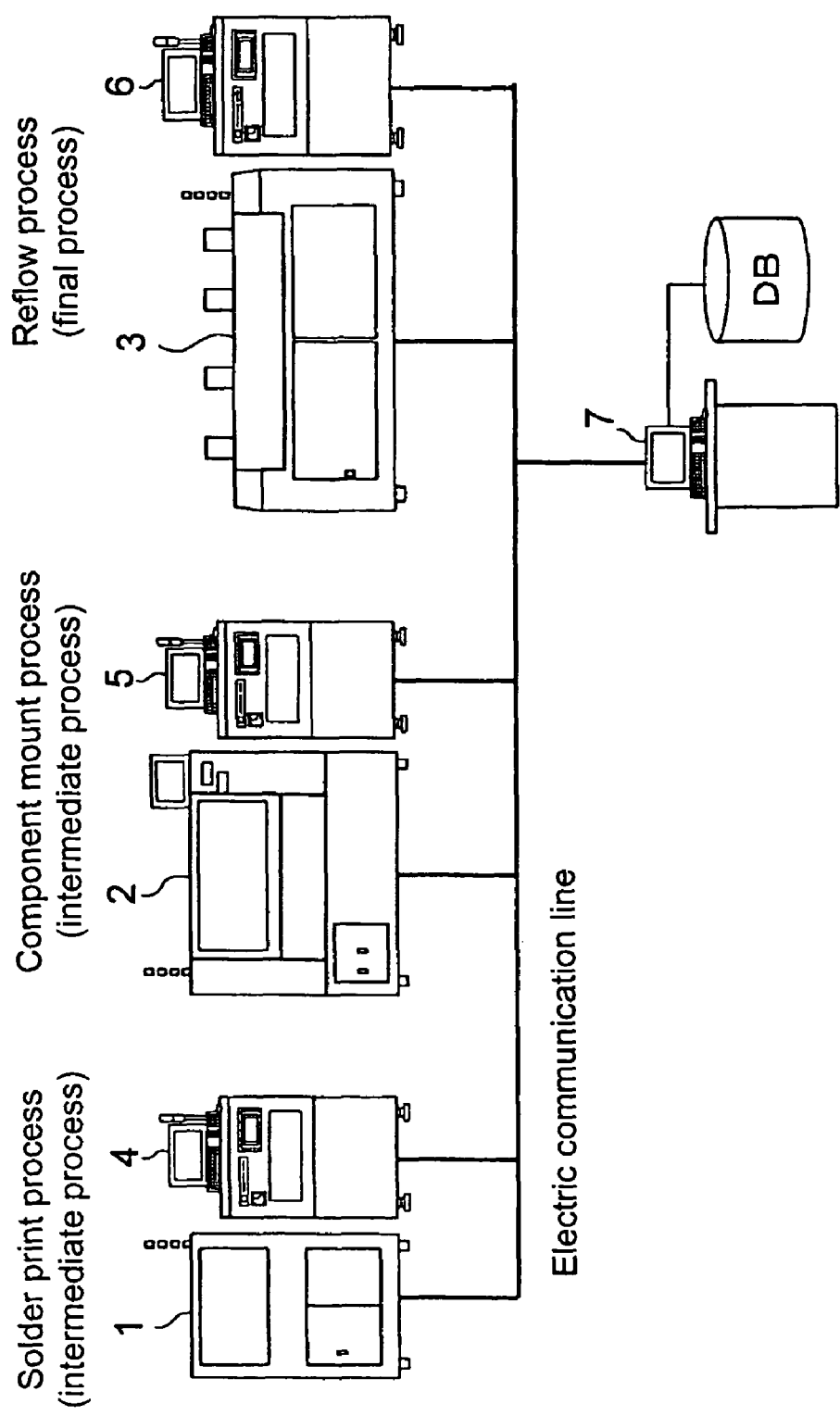
FIG. 1 shows a example system configuration of a surface mount line.

FIG. 1 shows a system constitution of a surface mount line.

This system comprises a solder printer 1, a component mount device 2 and a reflow device 3 as manufacturing devices. According to the surface mount line, the solder printer 1 prints a solder paste on each land of the printed board first (solder print process), and then the component mount device 2 mounts an electronic component on the solder paste (component mount process) and finally the reflow device 3 solders the electronic component to the land by heating, melting and cooling the solder (reflow process).

In addition, this system comprises a print inspection device 4, a mount inspection device 5 and a board inspection device 6 as inspection devices. The print inspection device 4 is set downstream the solder printer 1 and inspects a printed quality of the solder paste in the solder print process of an intermediate process. The mount inspection device 5 is set downstream the component mount device 2 and inspects a mount quality of the component in the component mount process of an intermediate process. Furthermore, the board inspection device 6 is set downstream the reflow device 3 and inspects a completed product in the reflow process of a final process. Namely, the print inspection device 4 and the mount inspection device 5 are process inspection devices and the board inspection device 6 is a final inspection device.

An information processing device 7 can be a general-purpose computer comprising a CPU, a memory, an auxiliary memory device, a display, an input unit and the like, and it is connected to the manufacturing devices and the inspection devices through an electric communication line such as a LAN. The information processing device 7 stores, manages and displays a manufacturing situation of the manufacturing device and an inspecting situation of the inspection device or manages, updates, and displays a manufacturing condition of the manufacturing device and an inspecting standard of the inspection device. According to this embodiment, an inspection standard setting device is constituted by the information processing device 7.

A description will be made of the inspection performed in each process in detail and then a description will be made of the inspection standard setting device in detail hereinafter.

(Process Inspection 1:Solder Print Process)

When the print inspection device 4 receives a solder-printed board, it takes a picture of the printed board using an imaging device and obtains an image of each component (each land) on the printed board. Each image is managed so as to become unique by a combination of an identification number and a component number of the printed board.

The print inspection device 4 inspects a plurality of inspection items using this image. FIG. 2 is a list showing an example of inspection items in the solder print process. The inspection items include an insufficient solder inspection, an excessive solder inspection, a relative X-displacement inspection of the solder and the land, a relative Y-displacement inspection of the solder and the land, a sag/blur inspection (in a vertical direction), a sag/blur inspection (in a horizontal direction) and the like. The kind and unit of a feature extracted from the image and an inspection standard to be compared with the value of the feature are set for each inspection item.

For example, when conducting the insufficient solder inspection, the print inspection device 4 specifies a land region by, for example template matching, etc. and then extracts a region having a solder color and calculates a rate (%) of a solder area to a land area. Thus, when its calculation result is smaller than an inspection standard showing an allowable value of the solder area, a defect (insufficient solder) is determined.

In addition, according to the relative X-displacement inspection of the solder and the land, the print inspection device 4 specifies a land region by a template matching and the like and extracts a region having a solder color and calculates a difference (mm) between the gravity center of the land and the gravity center of the solder in an X direction. Thus, when its calculation result is greater than an inspection standard showing an allowable displacement in the X direction, a defect (X-displacement) is determined.

Thus, the print inspection device 4 automatically makes determinations for the plurality of inspection items. The extracted feature and determination result in each inspection item is transmitted to the information processing device 7 and stored in an inspection result DB of the information processing device 7.

When the defect is determined in any of the inspection items, the printed board is removed from the line to be reinspected. Thus, the unqualified printed board is prevented from being sent to the next process (the component mount process).

(Process Inspection 2:Component Mount Process)

When the mount inspection device 5 receives the component mounted printed board, it takes a picture of the printed board using an imaging device and obtains an image of each component (each land) on the printed board. Each image is indexed by, in this case, the combination of the identification number and the component number of the printed board.

The mount inspection device 5 inspects a plurality of inspection items using this image. FIG. 3 is a list showing an example of inspection items in the component mount process. The inspection items include an angle inspection, a lateral displacement inspection, a vertical displacement inspection, etc. The kind and unit of a feature extracted from the image and an inspection standard to be compared with the value of the feature are set for each inspection item.

For example, during the angle inspection, the mount inspection device 5 specifies a component body region by a template matching and the like and then calculates an inclined angle (degree) of the component body region based on the horizontal direction of the image. Thus, when its calculation result is smaller than an inspection standard showing an allowable inclination of the component, a defect (component inclination) is determined.

In addition, during to the lateral displacement inspection, the mount inspection device 5 specifies a component body region by a template matching and the like and calculates a horizontal coordinates (mm) of the gravity center of the component body region when it is assumed that an upper left of the image is set to an original point. Thus, when its calculation result is greater than an inspection standard showing an allowable displacement in the horizontal direction, a defect (lateral displacement) is determined.

Thus, the mount inspection device 5 automatically makes determinations for the plurality of inspection items. The extracted feature and determination result in each inspection item is transmitted to the information processing device 7 and stored in the inspection result DB of the information processing device 7.

When the defect is determined in any of the inspection items, the printed board is removed from the line to be reinspected. Thus, the unqualified printed board is prevented from being sent to the next process (reflow process).

(Final Inspection: Reflow Process)

Defects generated after the reflow are of various kinds such as a fillet defect (a configuration of the solder is not appropriate), a wet defect (a junction between the solder and the land or between the solder and the electrode of the component has a defect), a bridge (the solder is attached so as to cause short circuit between the electrodes of the component), a mount defect (the component or the solder is off the land), and a component defect (the component does not exist). The board inspection device 6 inspects a plurality of items and automatically determines whether the product is good or defective.

In the board inspection device 6 according this embodiment, a so-called color highlighting method is employed. According to the color highlighting method, the board is irradiated with a plurality of light sources having different incident angles (three colors light of red, green, blue, for example) and their reflected light are taken to obtain a pseudo-color image of the three-dimensional configuration of the solder (fillet configuration), so that the soldering quality is inspected from a color distribution, of the pseudo-color image.

The determination result of the board inspection device 6 is transmitted to the information processing device 7 and stored in the inspection result DB of the information processing device 7.

(Inspection Standard Setting Device)

As factors of defect generation, various factors such as a problem of a manufacturing condition or a processing procedure in each process (problem in process), a structural problem of the board or the component itself (problem in design) or an improperness of the inspection standard in the process inspection (problem in process inspection) are considered. Given this dependence it is necessary to determine whether the defect generation factor lies in the process, the design, or in the process inspection before taking measures with respect to the defect generated.

When the defect generation factor lies in the process or the design, this has a large effect as it may lead to process improvement or design reconsideration. On the other hand, when it lies in the process inspection, the aforementioned measures are implemented only by adjusting the inspection standard to an appropriate value (that is, a value which can detect a defect sign); this is advantageous in view of time and cost.

However, it is not easy to determine whether there is a problem in the inspection standard of the process inspection using conventional methods because in general it cannot be determined which inspection standard or how the inspection standard of an inspection item was adjusted. Since there are dozens of inspection items in the process, it is not practical to adjust the inspection standard by trial and error (on an ad hoc basis).

Thus, according to this embodiment, as is hereafter described, the inspection standard setting device finds the inspection item whose inspection standard is to be reset (target item) and automatically adjusts the inspection standard or supports a user by analyzing the data stored in the process inspection and the final inspection.

Figure 4:
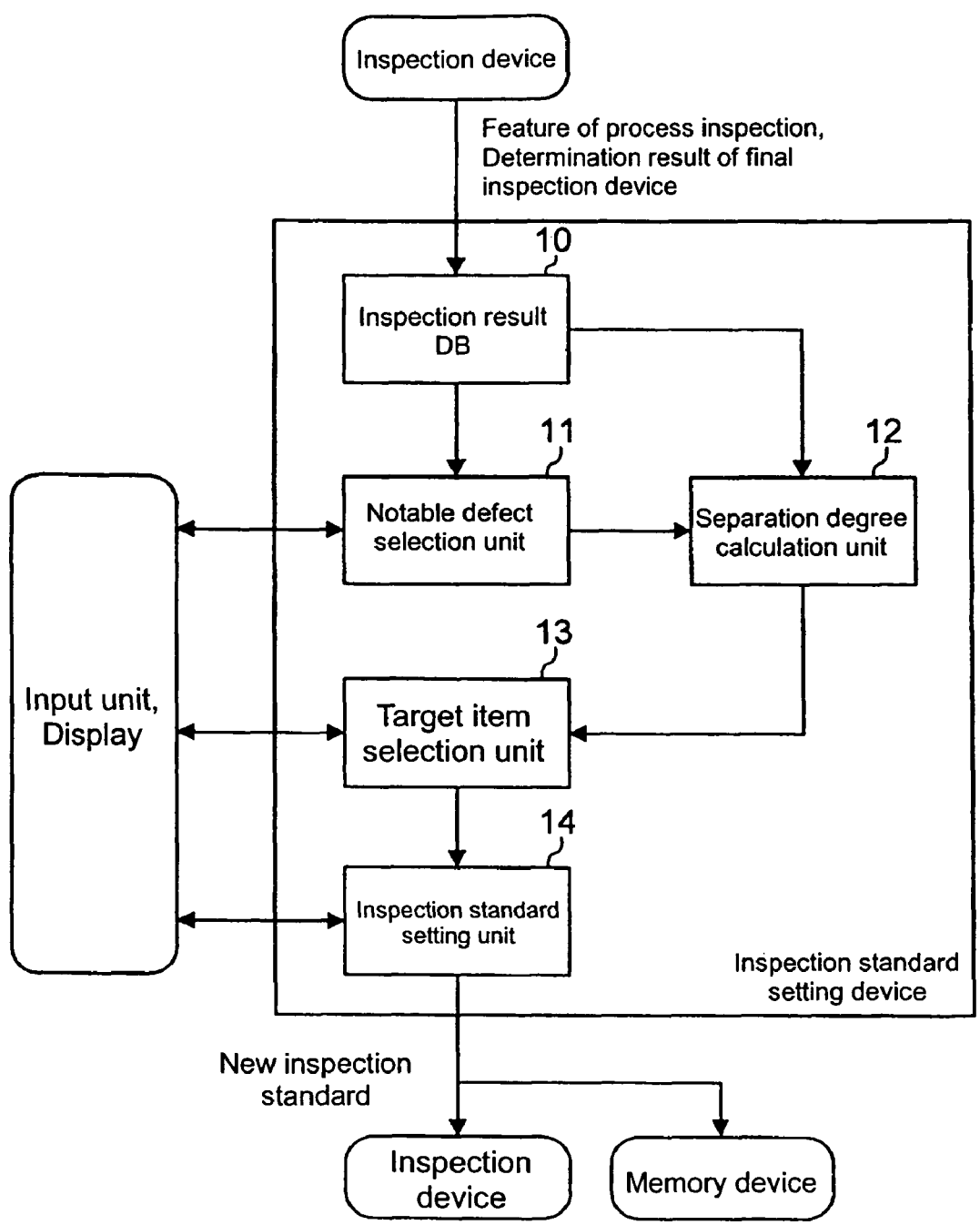
FIG. 4 shows an example configuration of an inspection standard setting device.

FIG. 4 shows an exemplary functional configuration of the inspection standard setting device. The inspection standard setting device mainly comprises an inspection result DB 10, a notable defect selection unit 11, a separation degree calculation unit 12, a target item selection unit 13 and an inspection standard setting unit 14. These are implemented when the information processing device 7 executes an inspection standard setting program.

The inspection result DB 10 is provided in the auxiliary memory device (magnetic memory device or optical memory device, etc.) of the information processing device 7. FIG. 5 shows an example of a data structure of the inspection result DB 10. Each record of the inspection result DB 10 corresponds to one component which is uniquely specified by a combination of the board number and the component number. Each record contains at least a value of the extracted feature of each inspection item of the process inspection and determination result of each defect item of the final inspection.

The notable defect selection unit 11 selects a defect item to be analyzed based on the determination results of the plurality of products stored in the inspection result DB 10. The separation degree calculation unit 12 calculates a degree of separation of each inspection item of the process inspection based on the data of the plurality of products stored in the inspection result DB 10. The degree of separation is an index showing how much the product determined to be good and the product determined to be defective are separated in the distribution of the extracted features of a certain inspection item. In addition, the target item selection unit 13 selects the inspection item whose inspection standard is to be reset based on the separation degree. The inspection standard setting unit 14 sets a new inspection standard for the selected inspection item.

In the above-described process each result is displayed on the display of the information processing device 7 or outputted to the auxiliary memory device as data. In addition, when a user input is needed in each process, the user can input information using the input unit of the information processing device 7.

(Inspection Standard Setting Process)

A flow of the process of the inspection standard setting device will be described with reference to a flowchart in FIG. 6.

Figure 7:
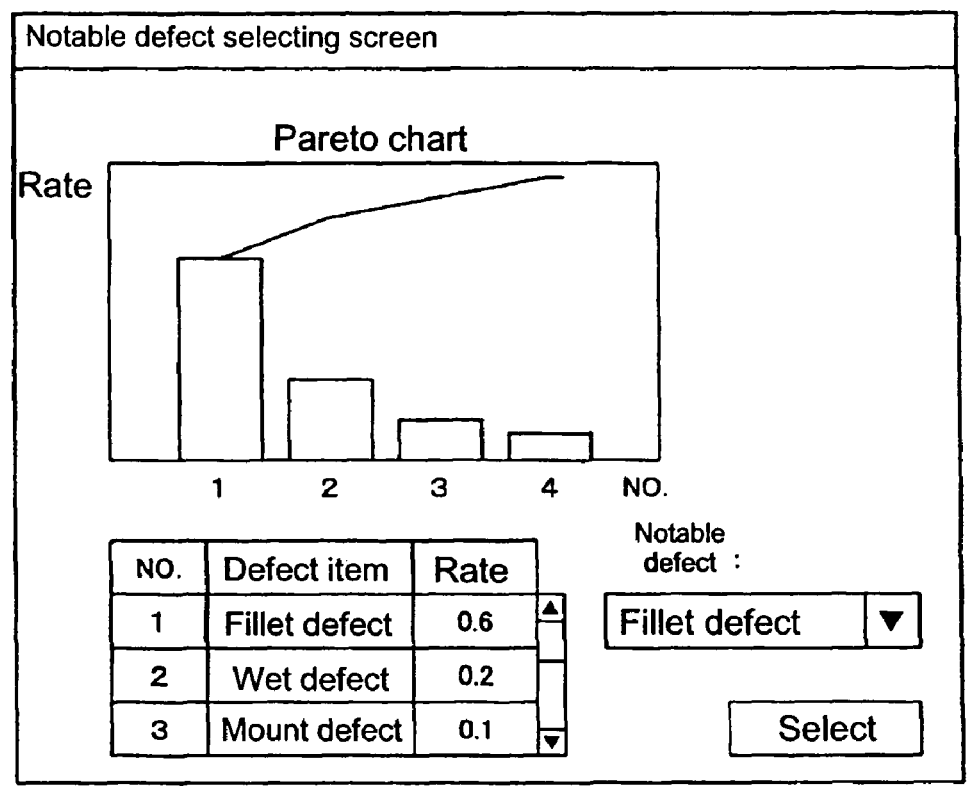
FIG. 7 shows an example of a notable defect selecting screen.

At step S1, the notable defect selection unit 11 aggregates the determination results of the plurality of products stored in the inspection result DB 10 and calculates a generation frequency of each defect item (defect rate). Then, it selects the defect item having the highest generation frequency as the "notable defect" to be analyzed. FIG. 7 shows an example of a notable defect selection screen outputted from the notable defect selection unit 11. According to this screen, the generation frequency of each defect item is shown in a Pareto chart and a list. Although the defect item "fillet defect" having the highest generation frequency is selected as the notable defect on an initial display, the user can designates another defect item by operating the input unit. Since the defective items are arranged in decreasing order of the generation frequency in the Pareto chart and the list, the user can grasp the problem at a glance. Thus, when one object to be analyzed is selected, correlation at the next stage can be easily evaluated.

At step S2, the separation degree calculation unit 12 finds a correlation (causal correlation) between each inspection item and the notable defect. Here, as an index showing a strength in correlation, a separation degree between the distribution of the feature of the product which was determined as good product at the final inspection and the distribution of the feature of the product which was determined as the defective product is employed.

Figure 8:
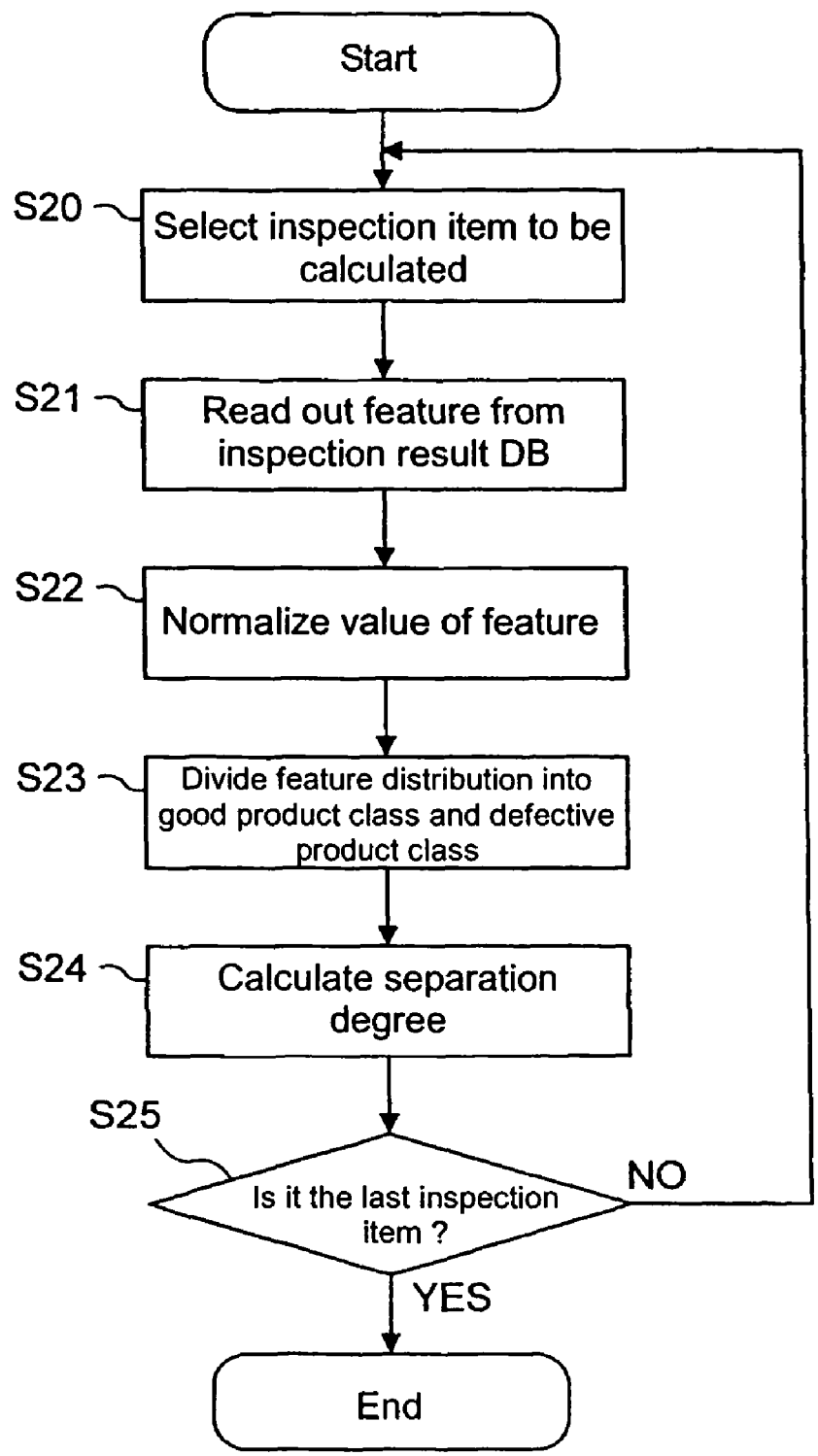
FIG. 8 shows a flowchart of an separation degree calculating process.

FIG. 8 shows a flow of the separation degree calculation process of this embodiment. The separation degree calculation unit 12 selects an inspection item to be calculated at step S20 and reads the feature of the inspection item from the inspection result DB at step S21. Then, it normalizes the value of each feature so that dispersion of the feature distribution may become 1 at step S22.

Then, it divides the feature distribution into two classes based on a predetermined threshold value ("1", for example) and the product belonging to one class is regarded as the good product and the product belonging to the other class is regarded as the defective product at step S 23. The class containing "good products" depends on contents of the inspection item. That is, in the case of the inspection item in which determination is made with an allowable maximum value, the class having a value smaller than the threshold value is determined to be the good product class, and in the case of the inspection item in which determination is made with an allowable minimum value, the class having a value greater than the threshold value is determined to be the good product class.

For example, the separation degree calculation unit 12 refers to the determination results of the inspection result DB 10 and finds:

the number "n11" belonging to the good product class among the products determined as the good products at the final inspection, the number "n12" belonging to the defective product class among the products determined as the good products at the final inspection, the number "n21" belonging to the good product class among the products determined as the defective products at the final inspection, and the number "n22" belonging to the defective product class among the products determined as the defective products at the final inspection, and calculates the separation degree (which can be referred to as a SN rate or odds rate) from the following formula at step S24.

$$\text{Seperation degree} = 10\log_{10}\left(\frac{p11 \times p22}{p12 \times p21}\right) \quad \text{[Formula 1]}$$

where $$p11 = \frac{n11}{n11 + n12},$$

$$p12 = \frac{n12}{n11 + n12},$$

$$p21 = \frac{n21}{n21 + n22},$$

$$p22 = \frac{n22}{n21 + n22}$$

In the above formula, (p11×p22) indicates a rate of the products having the same determination result made by the class separator and made at the final inspection and (p12× p21) indicates a rate of the products having the different determination results made by the class separator and made at the final inspection. Thus, as the rate of the products having the same determination result made by the class and made at the final inspection is increased, or the products having the different determination results is decreased, the separation degree is increased.

Figure 9A:
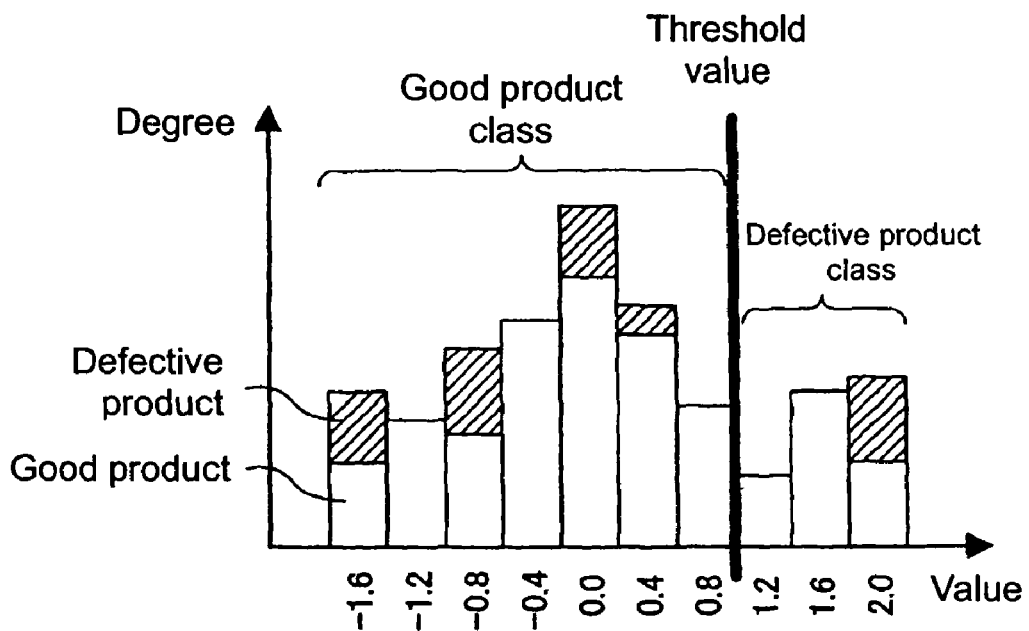
FIG. 9 shows an example of a histogram of a feature distribution.
Figure 9B:

FIGS. 9A and 9B show the normalized feature distribution as histograms. Hatched parts in the histogram indicate products which were determined as the good products at the final inspection. In addition, a part which is greater than the threshold value "1" is regarded as the defective product class and a part which is "1" or less is regarded as the good product class.

According to FIG. 9A, the features of the good product and the defective product are mixed over the whole histogram, in which a special difference in feature between both products cannot be recognized. When the correlation between the inspection item and the notable defect is small, the histogram has a pattern as shown in FIG. 9A. In this case the value of (p12×p21) is increased and the separation degree is decreased. Meanwhile, the features of the defective products are placed on the right side (defective product class side) of the histogram as shown in FIG. 9B. The special difference becomes distinct as the correlation between the inspection item and the notable defect is increased. In this case, since the value of (p11×p22) is increased, the separation degree is increased.

Thus, the strength of the correlation between the inspection item and the notable defect is quantified by the (index of the) separation degree. In addition, since the normalization is performed first and a value range of the feature is arranged every inspection item, the products can be divided into classes using the same threshold value, thereby simplifying the separation degree calculation process. In addition, since the separation degree is found regardless of the determination result of the process inspection, an objective separation degree can be calculated regardless of whether the inspection standard previously set in the process inspection is good or not.

Figure 6:
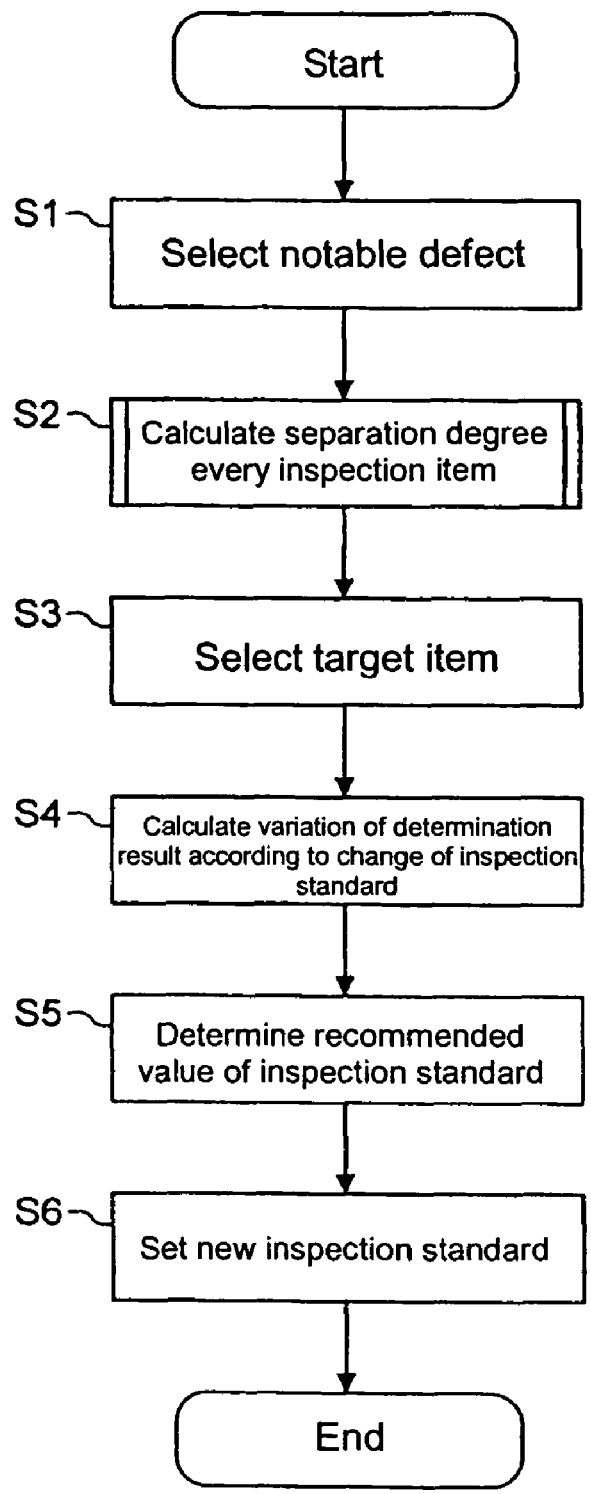
FIG. 6 shows a flowchart of an inspection standard setting process.

When the separation degrees for all inspection items are calculated at step S25, the operation proceeds to step S3 shown in FIG. 6.

Figure 10:
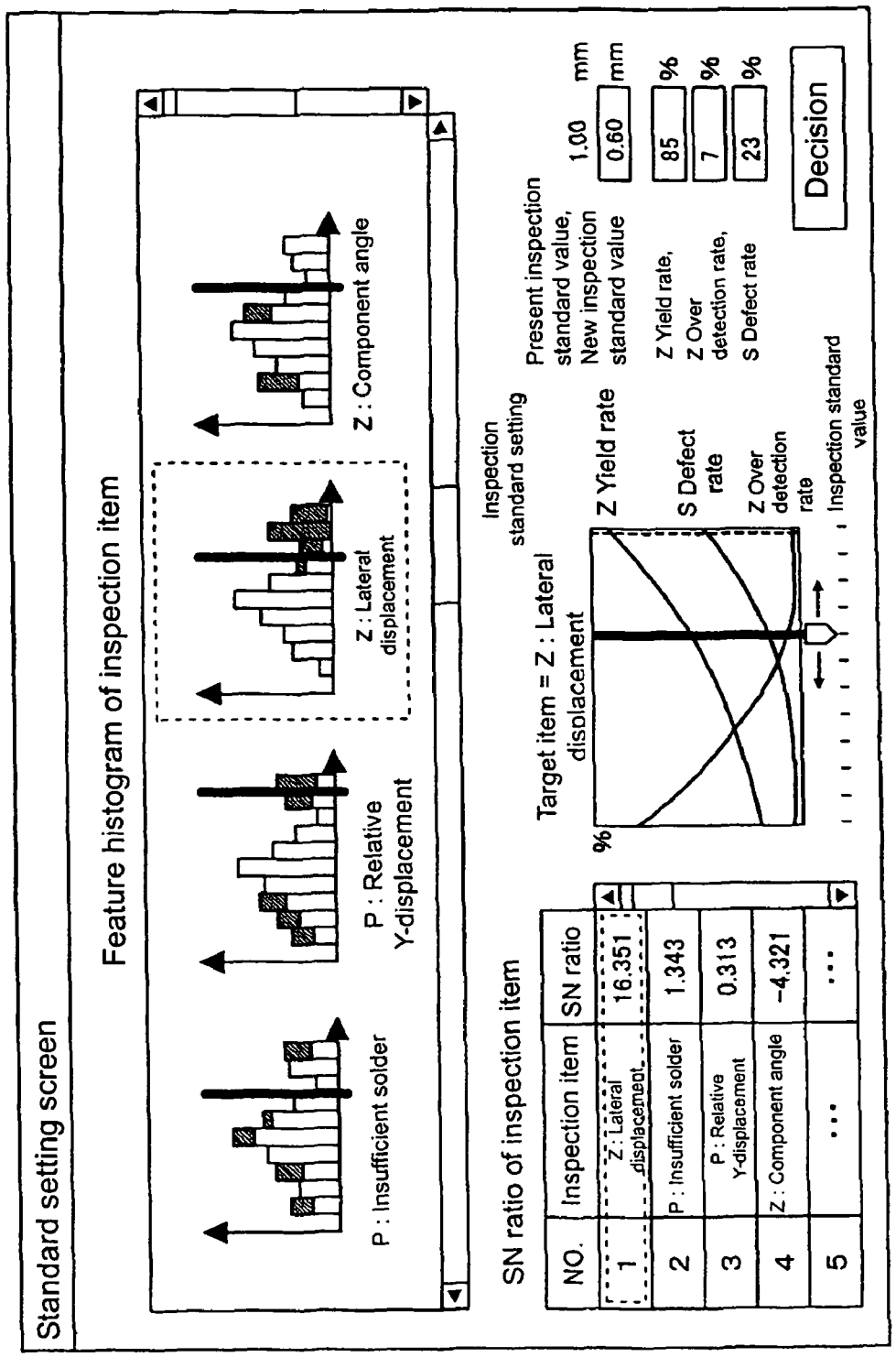
FIG. 10 shows an example of a standard setting screen.

At the step S3, the target item selection unit 13 selects an inspection item having the highest separation degree with respect to all other inspection items as the "target item" whose inspection standard is to be reset. FIG. 10 shows an example of a standard setting screen. A histogram for each inspection item is provided in an upper part of the screen and a list which shows inspection items and their separation degrees (SN rate) in decreasing order of the separation degree is provided in a lower left of the screen. Although the inspection item "Z: lateral displacement" having the highest separation degree is selected as the target item in an initial display, the user can designate a desired inspection item from the histogram or the list by operating the input unit. In addition, a reference character "P" designates the solder print process, a reference character "Z" designates the component mount process and a reference character "S" designates the reflow process in FIG. 10.

Then, at the step S4, the inspection standard setting unit 14 calculates a variation of the determination result of each of the process inspection and the final inspection for the target item selected at the step S3 when the inspection standard is changed. As shown in FIG. 11, the variation of the determination result of the process inspection may be designated by a yield rate or an over detection rate of the process inspection. In addition, the variation of the determination result of the final inspection may be designated by a yield rate or a defect rate of the final inspection. The over detection means that the product determined as the good product at the final inspection is determined as the defective product at the process inspection, and the over detection rate is a rate of an over detection defective product to the whole number of process inspections. The defect rate is a rate of the defective product to the whole number of final inspections.

After the variations of the determination results of the several inspection standards are calculated, the inspection standard setting unit 14 finds a reinspection cost expect value in each inspection standard using the following cost function. Then, the inspection standard setting unit 14 determines a value of the inspection standard whose reinspection cost expect value is smallest (that is, cost effect becomes maximum) as a recommended value at step S5.

$$\text{Reinspection cost expect value} = (1-Tf(x)) \times Cf + (1-Tm(x)) \times Cm \quad \text{[Formula 2]}$$

Where
x: value of inspection standard,
Tf(x): yield rate of final inspection,
Cf: reinspection cost of final inspection defective product,
Tm(x): yield rate of process inspection,
Cm: reinspection cost of process inspection defective product Variations of the "yield rate of the process inspection", "over detection rate of the process inspection", and "defect rate of the final inspection" of the target item when the inspection standards are changed are shown in a graph in a lower right of the standard setting screen. In addition, a bar showing the "present inspection standard"(broken line) and a bar showing the "new inspection standard"(solid line) are shown on the graph. On the initial display, the bar showing the new inspection standard is set at a position of the recommended value calculated at the step S5. Furthermore, values of the yield rate, the over detection rate and defect rate at the new inspection standard are displayed on the right side of the graph.

The user can move the bar showing the new inspection standard on the graph by operating the input unit. When the bar is moved (when the new value of the inspection standard is inputted (changed)), the yield rate, the over detection rate and the defect rate are calculated according to it and displayed. Thus, by such interface, the user can simulate the variation in determination result when the inspection standard is changed and find an optimal value of the inspection standard.

Then, when the user presses the "decision" button, the inspection standard setting unit 14 sets the new value of the inspection standard for the target item at step S6.

According to the above described inspection standard setting device, the inspection item having the strong correlation (causal correlation) with the notable defect, that is, the inspection item which can detect the defect sign correctly can be easily specified. In addition, the new inspection standard to detect the defect sign can be appropriately set for the specified inspection item.

Thus, when the process inspection is performed using this new inspection standard, an intermediate product having high probability of defect (having the defect sign) can be immediately removed. Since it is not necessary to perform the follow-up process for product showing a defect sign, the process can be implemented at low cost. In addition, since the number of the products to be finally inspected is reduced, the final inspection is made more efficient. Especially, when the final inspection is performed by the operator such as a viewing inspection, the effect is very great.

In addition, there is a case where the separation degrees of all of the inspection items have relatively small values and noticeable difference does not appear. In this case, it is determined that the factor of defect generation does not lie in the process inspection but in the process or the design. Thus, at the step S3, a maximum value of the separation degree or the dispersion are examined and when the maximum value of the separation degree or the dispersion does not reach a predetermined value, it is preferable that a message such as "improvement in defect rate cannot be expected by adjusting the inspection standard" is outputted or the inspection standard setting process is ended.

(Variation)

Although the separation degree is calculated for each inspection item in the previous embodiment, for another embodiement the separation degree may be calculated every several inspection items (that is, every combination of the inspection items). In this case, after a combination of the inspection items to be set based on the separation degree is determined, a new inspection standard may be set for any one of the inspection items in the combination or for all of the inspection items in the combination.

One example of a method of calculating the separation degree (SN rate) of the plurality of inspection items will be illustrated. The separation degree calculation unit 12 selects a combination of the inspection items to be calculated and then reads out the features of the inspection items from the inspection result DB. Then, it calculates a variance-covariance matrix and an average value vector of the values of the features. Then, a Mahalanobis distance Δ is calculated using the following formula:

$$\Delta^2 = (x-\mu)'\Sigma^{-1}(x-\mu) \qquad \text{[Formula 3]}$$

Where Δ is a Mahalanobis distance, Σ is a variance-covariance matrix, μ is an average value vector and x is a feature vector Then, the distribution of the Mahalanobis distance is divided into two classes for the good class and the defective class based on a predetermined threshold value ("1", for example). The remaining processes are the same as those in the previously described embodiment (FIG. 8).

Since the strength of correlation between the combination of the inspection items and the notable defect can be quantified, appropriate inspection standard can be set for the defect which is caused by the plurality of kinds of defect signs (compound defect factors).

Furthermore, a method of selecting the feature or the inspection standard in the inspection item is not limited to the above embodiment. For example, a plurality of kinds of combinations of the features and the inspection standards may be set in one inspection item and the defect may be determined when any one of features does not satisfy the inspection standard. Alternatively, the plurality of values of the features may be compiled to an index by a calculation (weighted sum, MTS method and the like) and the defect may be determined when the index does not satisfy the index.

What is claimed is:

1. An inspection standard setting device to set inspection standards to be used at a process inspection which executes the process inspection determining pass or fail of an intermediate product by comparing a feature extracted from the intermediate product with a predetermined inspection standard, and a final inspection determining pass or fail of a completed product at a final process, comprising:

a memory device for storing an extracted feature of each of a plurality of inspection items of the process inspection of the intermediate product and a determination result at the final inspection;

a separation degree calculation unit for calculating a separation degree showing how much the product determined to be good and the product determined to be defective at the final inspection are separated in a distribution of the extracted feature for every inspection item or every combination of the inspection items of the process inspection based on data of a plurality of products stored in the memory device;

a target item selection unit for selecting an inspection item whose inspection standard is to be reset from the inspection items or the combinations of the inspection items based on a value of the separation degree;

an inspection standard setting unit for setting a new inspection standard for the selected inspection item, wherein the inspection standard setting unit is configured to receive a user input indicating the new inspection standard and further configured to calculate and present variations of the determination results at the process inspection and the final inspection based on the new inspection standard; and an interface configured to allow the user to change one or more of the plurality of inspection items and to simulate and present the resulting variation in determination result as a function of inspection standard value, wherein the interface is configured to allow the user to find an optimal value of the inspection standard based on the simulated variation in determination result.

2. The inspection standard setting device according to claim 1, wherein the separation degree calculation unit further comprises a class separator that divides the feature distribution of the plurality of products into two classes and regards the product belonging to one class as the good product and the product belonging to the other class as the defective product, and wherein the separation degree calculation unit calculates the separation degree based on a rate of the products having the same determination result made by the class separator and at the final inspection and a rate of the products having the different determination result made by the class separator and at the final inspection.

3. The inspection standard setting device according to claim 2, wherein the separation degree is an index which is increased as the rate of the products having the same determination result made by the class separator and at the final inspection is increased or the rate of the product having the different determination results made by the class separator and at the final inspection is decreased.

4. The inspection standard setting device according to claim 1, wherein the target item selection unit selects the inspection item or the combination of the inspection items having the highest separation degree as the inspection item whose inspection standard is to be reset.

5. The inspection standard setting device according to claim 1, wherein the target item selection unit provides the plurality of inspection items or combinations of the inspection items arranged in decreasing order of the separation degree as candidates to be selected so that a user can select from the candidates the inspection item whose inspection standard is to be reset.

6. The inspection standard setting device according to claim 1, wherein the inspection standard setting unit calculates variations of the determination results at the process inspection and the final inspection in a case where the new inspection standard is used, calculates cost effects provided by the variations of the determination results using a predetermined cost function, and determines a new inspection standard so that the calculated cost effect may become a maximum value.

7. The inspection standard setting device according to claim 1, wherein the inspection standard setting unit calculates variations in at least one of a yield rate, an over detection rate, and a defect rate according to the new inspection standard.

8. The inspection standard setting device according to claim 7, wherein the inspection standard setting unit displays variations in at least one of the yield rate, the over detection rate, and the defect rate according to the new inspection standard.

9. The inspection standard setting device according to claim 7, wherein the inspection standard setting unit displays a graph showing variations of at least one of the yield rate, the over detection rate, and the defect rate over a range of values of the new inspection standard.

10. The inspection standard setting device according to claim 1, further comprising an interface to allow the user to change one or more inspection standards associated with the plurality of inspection items and to simulate the resulting variation in determination result.

11. A method for operating an inspection standard setting device configured to be used at a process inspection for a plurality of inspection items of a product on a production line which executes the process inspection determining pass or fail of an intermediate product by comparing a feature extracted from the intermediate product with a predetermined inspection standard, and a final inspection determining pass or fail of a completed product at a final process, the method comprising:
- storing, by a memory device, an extracted feature of each inspection item of the process inspection of the intermediate product and a determination result at the final inspection;
- calculating, by a separation degree calculation unit, a separation degree showing how much the product determined to be good and the product determined to be defective at the final inspection are separated in a distribution of the extracted feature for every inspection item or every combination of the inspection items of the process inspection based on data of a plurality of products stored in the memory device;
- selecting, by a target item selection unit, an inspection item whose inspection standard is to be reset from the inspection items or the combinations of the inspection items based on a value of the separation degree;
- setting, by an inspection standard setting unit, a new inspection standard for the selected inspection item, wherein the inspection standard setting unit is configured to receive a user input indicating the new inspection standard and further configured to calculate and present variations of the determination results at the process inspection and the final inspection based on the new inspection standard;
- changing, using an interface, one or more of the plurality of inspection items; and
- simulating and presenting the resulting variation in determination result as a function of inspection standard value, wherein the interface is configured to allow a user to find an optimal value of the inspection standard based on the simulated variation in determination result.

12. A non-transitory computer readable medium containing instructions stored therein for causing a computer processor to execute an inspection standard setting program to set inspection standards to be used at a process inspection for a plurality of inspection items on a production line which executes the process inspection determining pass or fail of an intermediate product by comparing a feature extracted from the intermediate product with a predetermined inspection standard, and a final inspection determining pass or fail of a completed product at a final process, by which an information processing device performs:
- a process for storing an extracted feature of each inspection item of the process inspection and a determination result at the final inspection;
- a process for calculating a separation degree showing how much the product determined to be good and the product determined to be defective at the final inspection are separated in a distribution of the extracted feature for every inspection item or every combination of the inspection items of the process inspection based on data of a plurality of products stored in the memory device;
- a process for selecting an inspection item whose inspection standard is to be reset from the inspection items or the combinations of the inspection items based on a value of the separation degree; and
- a process for setting a new inspection standard for the selected inspection item, the process comprising:
  - setting a new inspection standard for the selected inspection item;
  - calculating and presenting variations of the determination results at the process inspection and the final inspection based on the new inspection standard;
  - changing one or more of the plurality of inspection items; and
  - simulating and presenting the resulting variation in determination result as a function of inspection standard value, to determine an optimal value of the inspection standard based on the simulated variation in determination result.

13. A process inspection device comprising:
- a process inspecting unit for executing a process inspection for determining pass or fail of an intermediate product by comparing a feature extracted from the intermediate product with a predetermined inspection standard for a plurality of inspection items of the process inspection of the intermediate product;
- a memory device for storing an extracted feature of each inspection item at the process inspection and a determination result at the final inspection determining pass or fail of a completed product at a final process;
- a separation degree calculation unit for calculating a separation degree showing how much the product determined to be good and the product determined to be defective at the final inspection are separated in a distribution of the extracted features for every inspection item or every combination of the inspection items of the process inspection based on data of a plurality of products stored in the memory device;
- a target item selection unit for selecting an inspection item whose inspection standard is to be reset from the inspection items or the combinations of the inspection items based on a value of the separation degree; and
- an inspection standard setting unit for setting a new inspection standard for the selected inspection item, wherein the inspection standard setting unit is configured to receive a user input indicating the new inspection standard and further configured to calculate and present variations of the determination results at the process inspection and the final inspection based on the new inspection standard;
- an interface configured to allow the user to change one or more of the plurality of inspection items and to simulate and present the resulting variation in determination result as a function of inspection standard value, wherein the interface is configured to allow the user to find an optimal value of the inspection standard based on the simulated variation in determination result.

* * * * *